(12) United States Patent
Lim

(10) Patent No.: US 9,431,336 B2
(45) Date of Patent: Aug. 30, 2016

(54) SEMICONDUCTOR DEVICES AND METHODS OF MANUFACTURING THE SAME

(75) Inventor: Yong Hyun Lim, Seoul (KR)

(73) Assignee: SK Hynix Inc., Gyeonggi-do (KR)

( * ) Notice: Subject to any disclaimer, the term of this patent is extended or adjusted under 35 U.S.C. 154(b) by 162 days.

(21) Appl. No.: 13/598,569

(22) Filed: Aug. 29, 2012

(65) Prior Publication Data

US 2013/0341797 A1    Dec. 26, 2013

(30) Foreign Application Priority Data

Jun. 22, 2012    (KR) ................. 10-2012-0067392

(51) Int. Cl.
*H01L 27/115*    (2006.01)
*H01L 23/50*    (2006.01)

(52) U.S. Cl.
CPC ........... *H01L 23/50* (2013.01); *H01L 27/1157* (2013.01); *H01L 27/11573* (2013.01); *H01L 27/11575* (2013.01); *H01L 27/11582* (2013.01); *H01L 2924/0002* (2013.01)

(58) Field of Classification Search
CPC ................. H01L 27/11286; H01L 27/11293; H01L 27/11578; H01L 27/11582; H01L 27/11551; H01L 27/11526; H01L 27/11548; H01L 27/11556; H01L 27/11573; H01L 27/11757; H01L 27/11575
See application file for complete search history.

(56) References Cited

U.S. PATENT DOCUMENTS

| | | | |
|---|---|---|---|
| 8,633,099 B1 * | 1/2014 | Shih et al. ..................... | 438/598 |
| 2006/0091556 A1 * | 5/2006 | Shigeoka ...................... | 257/773 |
| 2009/0020744 A1 * | 1/2009 | Mizukami et al. ............... | 257/4 |
| 2011/0057251 A1 * | 3/2011 | Higashi ......................... | 257/324 |
| 2011/0151667 A1 * | 6/2011 | Hwang et al. ................ | 438/667 |

FOREIGN PATENT DOCUMENTS

KR    1020110070143    6/2011

* cited by examiner

*Primary Examiner* — Yu Chen
(74) *Attorney, Agent, or Firm* — IP & T Group LLP

(57) ABSTRACT

A semiconductor device includes a substrate including a memory cell region and a contact region, a string structure including conductive layers and first interlayer insulating layers alternately stacked over the substrate and protruded toward a lower layer from the memory cell region toward the contact region, barrier rib patterns spaced apart from one another over the conductive layers in the contact region and configured to open the layers of the conductive layers in the contact region through the spaced spaces, and first contact plugs filled into the space between barrier rib patterns adjacent to each other and coupled to the conductive layers in the contact region.

6 Claims, 12 Drawing Sheets

SEMICONDUCTOR DEVICES AND METHODS OF MANUFACTURING THE SAME

CROSS-REFERENCE TO RELATED APPLICATION

Priority to Korean patent application number 10-2012-0067392 filed on Jun. 22, 2012, the entire disclosure of which is incorporated by reference herein, is claimed.

BACKGROUND

Embodiments of this disclosure relate to semiconductor devices and methods of manufacturing the same and, more particularly, to a three-dimensional (3-D) semiconductor device and methods of manufacturing the same.

Semiconductor device technology has been focused on increasing the integration degree. In order to increase the integration degree of semiconductor devices, schemes for reducing the size of memory cells arranged in a 2-D way have been developed. A reduction in the size of the memory cells arranged in a 2-D way is limited. In order to overcome the limit, a 3-D semiconductor device in which memory cells are arranged in a 3-D way over a substrate has been proposed. The 3-D semiconductor device may efficiently utilize the area of the substrate and increase the integration degree as compared with the case where the memory cells are arranged in a 2-D way. The 3-D semiconductor device is developing toward various directions in order to improve reliability of the manufacture process and performance.

BRIEF SUMMARY

An exemplary embodiment of this disclosure relates to semiconductor devices, which are capable of improving reliability of a semiconductor device, and methods of manufacturing the same.

In an aspect, a semiconductor device may include a substrate including a memory cell region and a contact region, a string structure including conductive layers and first interlayer insulating layers alternately stacked over the substrate and protruded toward a lower layer from the memory cell region toward the contact region, barrier rib patterns spaced apart from one another over the conductive layers in the contact region and configured to open the layers of the conductive layers in the contact region through the spaced spaces, and first contact plugs filled into the space between barrier rib patterns adjacent to each other and coupled to the conductive layers in the contact region.

In an aspect, a method of manufacturing a semiconductor device may include forming a string structure and barrier rib patterns over a substrate including a memory cell region and a contact region, wherein the string structure, protruded toward a lower layer from the memory cell region toward the contact region, includes conductive layers and first interlayer insulating layers alternately stacked, and the barrier rib patterns over the conductive layers in the contact region are spaced apart from one another, and configured to open the layers of the respective conductive layers in the contact region through the spaced spaces; and forming first contact plugs coupled to the conductive layers by gap-filling a space between barrier rib patterns in the contact region.

DESCRIPTION OF EMBODIMENTS

Hereinafter, some exemplary embodiments of the present disclosure will be described in detail with reference to the accompanying drawings. The figures are provided to allow those having ordinary skill in the art to understand the scope of the embodiments of the disclosure.

Figure 1:
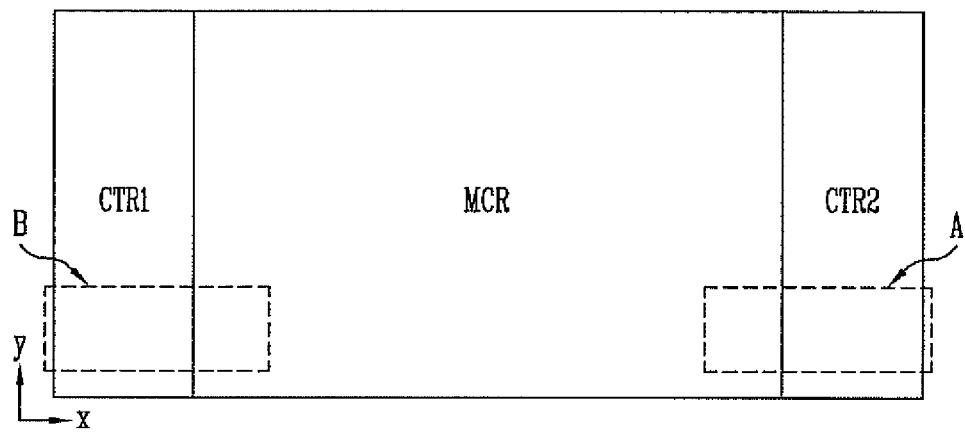
FIG. 1 is a diagram showing the memory cell region and the contact regions of a semiconductor device according to embodiments of this disclosure.

FIG. 1 is a diagram showing the memory cell region and the contact regions of a semiconductor device according to embodiments of this disclosure. More particularly, FIG. 1 is a diagram showing the arrangement of the memory cell region and the contact regions in the XY plane.

Referring to FIG. 1, the semiconductor device includes a memory cell region MCR and contact regions CTR1 and CTR2. A plurality of memory cells arranged in a 3-D way is formed in the memory cell region MCR. The plurality of memory cells arranged in a 3-D way is coupled in series between select transistors, thus forming memory strings. Lines extended from the memory cell region MCR are formed in the contact regions CTR1 and CTR2. Contact plugs that couple the lines of the memory strings and peripheral circuits are formed in the contact regions CTR1 and CTR2. In FIG. 1, the contact regions CTR1 and CTR2 are illustrated as being gate line contact regions including the gate lines of the memory strings extended from the memory cell region MCR. The gate line contact regions include the first contact region CTR1 and the second contact region CTR2. The memory cell region MCR is interposed between the first and second contact regions CTR1 and CTR2.

Figure 2A:
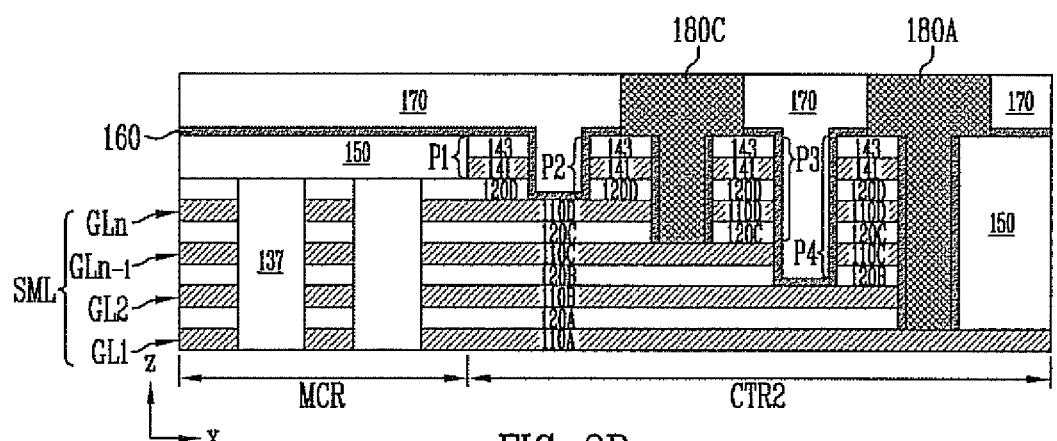
FIGS. 2A and 2B shows cross-sectional views of a semiconductor device according to embodiments of this disclosure.
Figure 2B:
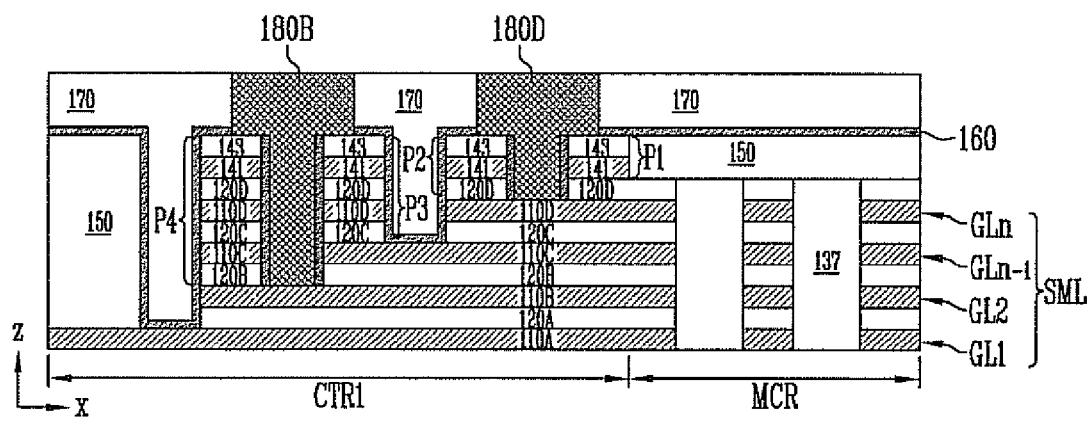

FIGS. 2A and 2B shows cross-sectional views of the semiconductor device according to embodiments of this disclosure. More particularly, FIG. 2A is a cross-sectional view of a region 'A' in the semiconductor device of FIG. 1, and FIG. 2B is a cross-sectional view of a region 'B' in the semiconductor device of FIG. 1.

Referring to FIGS. 2A and 2B, the semiconductor device includes the memory cell region MCR and the first and the second contact regions CTR1 and CTR2. The memory cell region MCR locates between the first and the second contact regions CTR1 and CTR2. Memory strings, each including select transistors and memory cells coupled in series between the select transistors, are formed in the memory cell region MCR. The select transistors and the memory cells of the memory strings are coupled in series by vertical channel layers 137. The memory cells of the memory strings may be stacked between a lower select transistor and an upper select transistor. According to embodiments, the memory cells of the memory strings may be stacked at both ends of a pipe transistor. In this case, a first group of the memory cells stacked over one end of the pipe transistor and a second group of the memory cells stacked over the other end of the pipe transistor are coupled by the pipe transistor. Furthermore, drain select transistors are stacked over the first group of memory cells. Source select transistors are stacked over the second group of memory cells. For the sake of convenience, the pipe transistor is not shown in the drawings. Although not shown, the pipe transistor includes a pipe channel layer configured to couple a pair of the vertical channel layers 137 and a pipe gate configured to surround the pipe channel layer with a gate insulating layer interposed between the pipe gate and the pipe channel layer. The memory strings are formed over a substrate (not shown), including the memory cell region MCR and the first and the second contact regions CTR1 and CTR2. The vertical channel layers 137 are upwardly protruded from the substrate.

A string structure SML, including the gate lines GL1 to GLn and first interlayer insulating layers 120A to 120D of the memory strings which are alternately stacked, is formed over the substrate. The gate lines GL1 to GLn and the first interlayer insulating layers 120A to 120D are configured to surround the vertical channel layers 137. The gate lines GL1 to GLn and the first interlayer insulating layers 120A to 120D are extended from the memory cell region MCR to the first and the second contact regions CTR1 and CTR2. The gate lines GL1 to GLn and the interlayer insulating layers 120A to 120D are protruded toward a lower layer from the memory cell region MCR toward the first and the second contact regions CTR1 and CTR2. The number of each of the gate lines GL1 to GLn and the first interlayer insulating layers 120A to 120D may be set in various ways depending on the number of memory cells to be stacked and the number of select transistors. Gate lines placed in one or more layers from a gate line placed in the highest layer, from among the gate lines GL1 to GLn, may be used as the gate lines of the select transistor. The remaining gate lines disposed under the gate lines of the select transistor may be used as the gate lines of the memory cells.

The vertical channel layers 137 are formed to penetrate the gate lines GL1 to GLn and the first interlayer insulating layers 120A to 120D in the memory cell region MCR. The outside wall of the vertical channel layer 137 may be surrounded by a multi-layered layer including a tunnel insulating layer, a charge trap layer, and a charge blocking layer. In other embodiments, the multi-layered layer may be formed along the top and bottom surfaces of the layers of the gate lines GL1 to GLn and sidewalls of the layers of the gate lines GL1 to GLn adjacent to the vertical channel layer 137. In other embodiments, at least one of the tunnel insulating layer, the charge trap layer, and the charge blocking layer may be formed to surround the outside wall of the vertical channel layer 137. The other layers may be formed along the top and bottom surfaces of the layers of the gate lines GL1 to GLn and sidewalls of the layers of the gate lines GL1 to GLn adjacent to the vertical channel layer 137.

In the first and the second contact regions CTR1 and CTR2, barrier rib patterns P1 to P4 are formed over the gate lines GL1 to GLn. The barrier rib patterns P1 to P4 are formed to self-align first and second contact plugs 180A to 180D. The barrier rib patterns P1 to P4 are located to open the gate lines GL1 to GLn-1 in the first and the second contact regions CTR1 and CTR2 through the space which is between the barrier rib patterns P1 to P4 adjacent to each other. More particularly, the barrier rib patterns P1 to P4 may be formed over the edges of the gate lines GL1 to GLn-1 and over the string structure SML in the first and the second contact regions CTR1 and CTR2 adjacent to the memory cell region MCR. The barrier rib patterns P1 to P4 may be spaced apart from one another at the same interval. A second interlayer insulating layer 150 may be formed over the gate line GL1 placed in the lowest layer. The gate line GL1 in the lowest layer is opened through the space between the second interlayer insulating layer 150 and the barrier rib pattern P4. Accordingly, the second contact plug 180A may be formed between the second interlayer insulating layer 150 and the barrier rib pattern P4 adjacent to the second interlayer insulating layer 150. The second contact plug 180A is separated from the first contact plugs 180B to 180D with the barrier rib patterns P2 to P4. The second interlayer insulating layer 150 is filled between the barrier rib patterns P1 adjacent to the memory cell region MCR and may also be formed over the string structure SML.

The barrier rib patterns P1 to P4 may include one or more layers of stack layers. The top surfaces of the barrier rib patterns P1 to P4 may be disposed on the same line. To this end, the barrier rib patterns P1 to P4 include a larger number of the stack layers, as the barrier rib patterns P1 to P4 are located far from the memory cell region MCR. Thus, the barrier rib patterns P1 to P4 have a higher height as the barrier rib patterns P1 to P4 are located far from the memory cell region MCR. Each of the barrier rib patterns P1 to P4 may include a barrier rib mask material layer 143. Each of the barrier rib patterns P1 to P4 may further include a mask layer 141 disposed under the barrier rib mask material layer 143. The mask layer 141 may be made of the same conductive material as the conductive layers 110A to 110D for forming the gate lines GL2 to GLn. Otherwise, the mask layer 141 may be formed of an insulating material layer, e.g., a nitride layer having a different etch selectivity against the conductive layers 110A to 110D and the first interlayer insulating layers 120A to 120C. The stack layers of barrier rib patterns, located in the same level of the gate lines GL2 to GLn, are formed of the same conductive layers 110B to 110D as the gate lines GL2 to GLn. The stack layers of barrier rib patterns, located in the same level of the first interlayer insulating layers 120C and 120D, are made of the same insulating material as the first interlayer insulating layers 120C and 120D.

The second interlayer insulating layer 150 may be formed to have a top surface disposed in the same line as the top surfaces of the barrier rib patterns P1 to P4.

A thin insulating layer 160 is formed on the opened surfaces of the barrier rib patterns P1 to P4 and the second interlayer insulating layer 150. A third interlayer insulating layer 170 is formed over the thin insulating layer 160. The third interlayer insulating layer 170 is filled into an space between the barrier rib patterns P1 to P4 and another space between the second interlayer insulating layer 150 and the barrier rib pattern P4 adjacent to the second interlayer insulating layer 150. The thin insulating layer 160 is formed of a material layer having a different etch selectivity against the third interlayer insulating layer 170. For example, the thin insulating layer 160 may be formed of a nitride layer.

The first and the second contact plugs 180A to 180D penetrate the third interlayer insulating layer 170 and the thin insulating layer 160. The first and the second contact plugs 180A to 180D are extended up to the top surfaces of the gate lines GL1 to GLn. The first and the second contact plugs 180A to 180D are coupled to the gate lines GL1 to GLn. The first contact plugs 180B to 180D are self-aligned between barrier rib patterns adjacent to each other. The second contact plug 180A is self-aligned between the second interlayer insulating layer 150 and the barrier rib pattern P4 adjacent to the second interlayer insulating layer 150. The thin insulating layer 160 is disposed between the sidewalls of the first and the second contact plugs 180A to 180D and the barrier rib patterns P1 to P4 and between the sidewall of the barrier rib pattern P4 and the second interlayer insulating layer 150 adjacent to the barrier rib pattern P4. Furthermore, the thin insulating layer 160 is disposed on the surfaces of the barrier rib patterns P1 to P4, opened by the first and the second contact plugs 180A to 180D, and the second interlayer insulating layer 150.

Each of the first and the second contact plugs 180A to 180D may be divided into: an upper end, penetrating the third interlayer insulating layer 170 and the thin insulating layer 160; and a lower end under the upper end. The upper end may have a wider width than the lower end. As a result, each of the first and the second contact plugs 180A to 180D may have a T-shaped section.

The first and the second contact plugs 180A to 180D may be arranged in zigzags in the first and the second contact regions CTR1 and CTR2, respectively, in order to secure an alignment margin. Furthermore, a first group contact plug (180B, 180D), coupled to even-numbered gate lines GL2 and GLn among the first and the second contact plugs 180A to 180D, and a second group contact plug (180A, 180C), coupled odd-numbered gate lines GL1 and GLn-1 among the first and the second contact plugs 180A to 180D, may be disposed in different contact regions. For example, if the first group contact plug (180B, 180D) is disposed in the first contact region CTR1, the second group the contact plug (180A, 180C) may be disposed in the second contact region CTR2.

The semiconductor device according to other embodiments of this disclosure may prevent misalignment between the contact plugs 180A to 180D and the gate lines GL1 to GLn because the contact plugs 180A to 180C may be self-aligned between the barrier rib patterns P1 to P4. Accordingly, reliability of the semiconductor device according to the embodiments of this disclosure may be improved.

Various methods of manufacturing a semiconductor device according to other embodiments of this disclosure are described in detail in connection with the region A of FIG. 1.

Figure 3A:
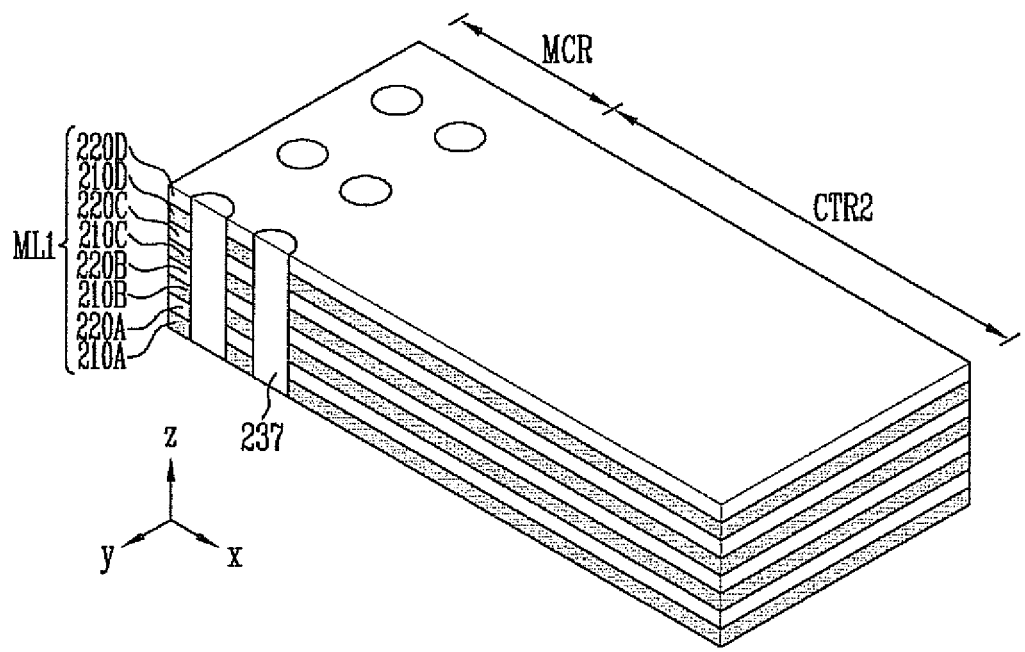
FIGS. 3A to 3R are perspective views of a method of manufacturing a semiconductor device according to a first embodiment of this disclosure.
Figure 3B:
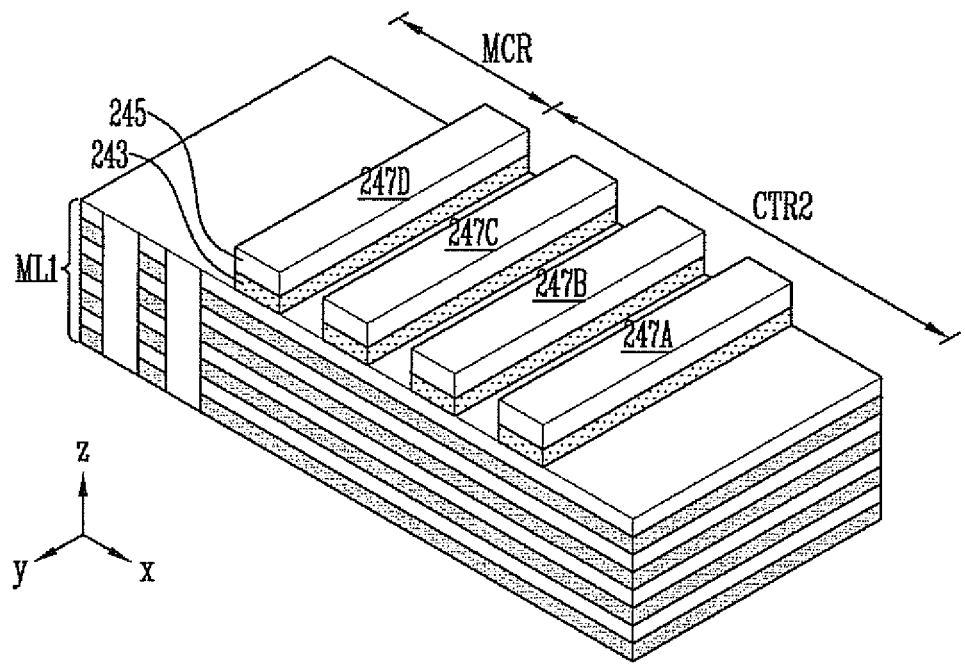
Figure 3C:
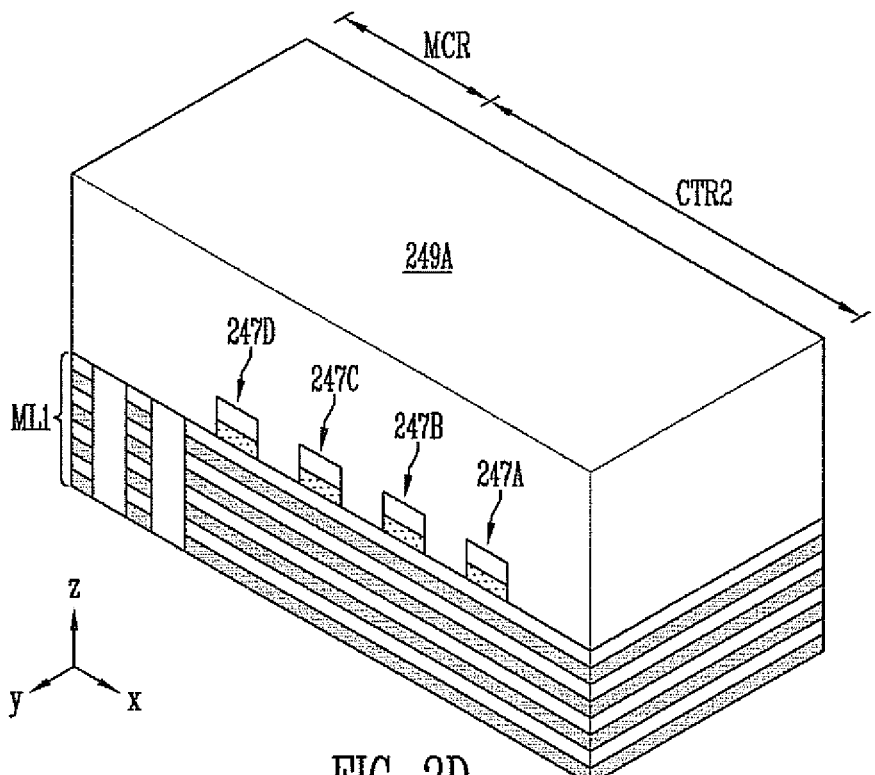
Figure 3D:
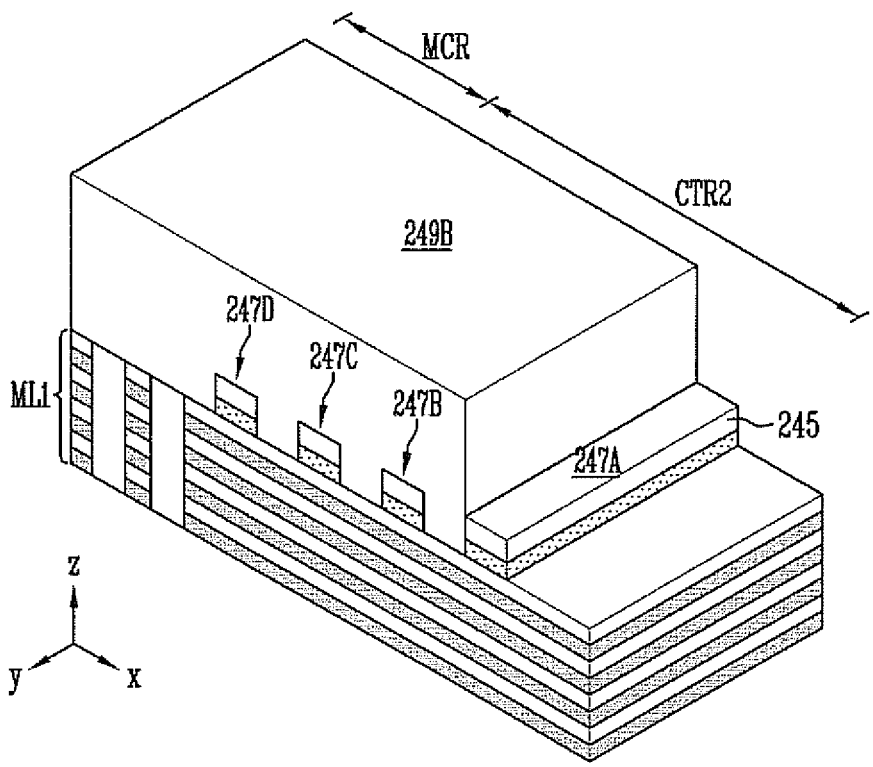
Figure 3E:
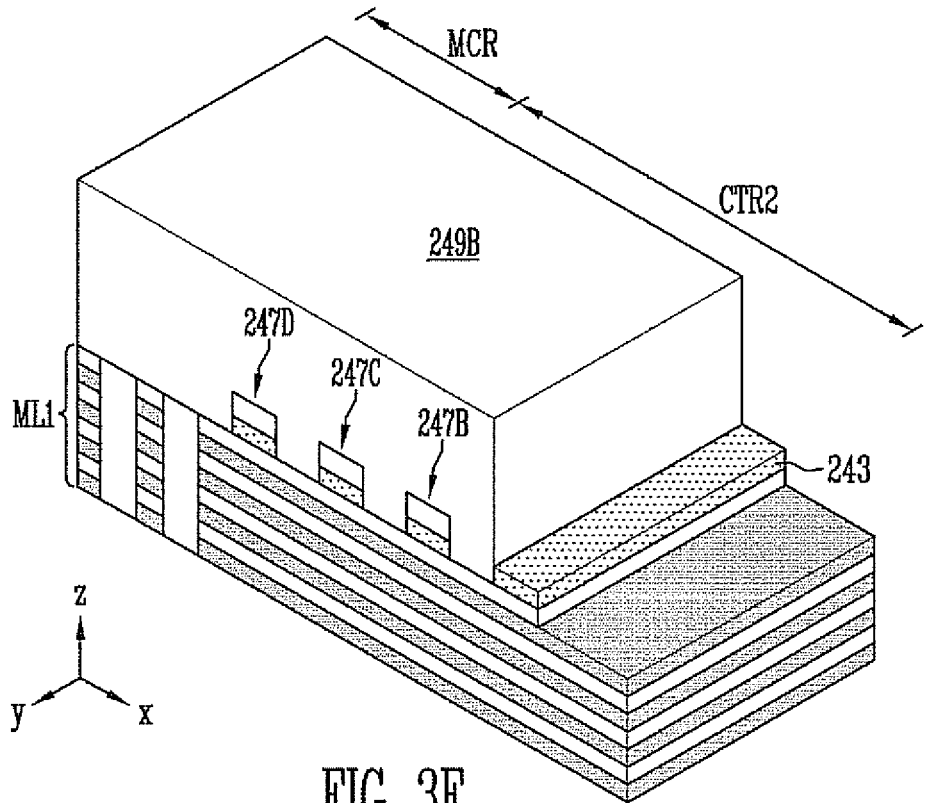
Figure 3F:
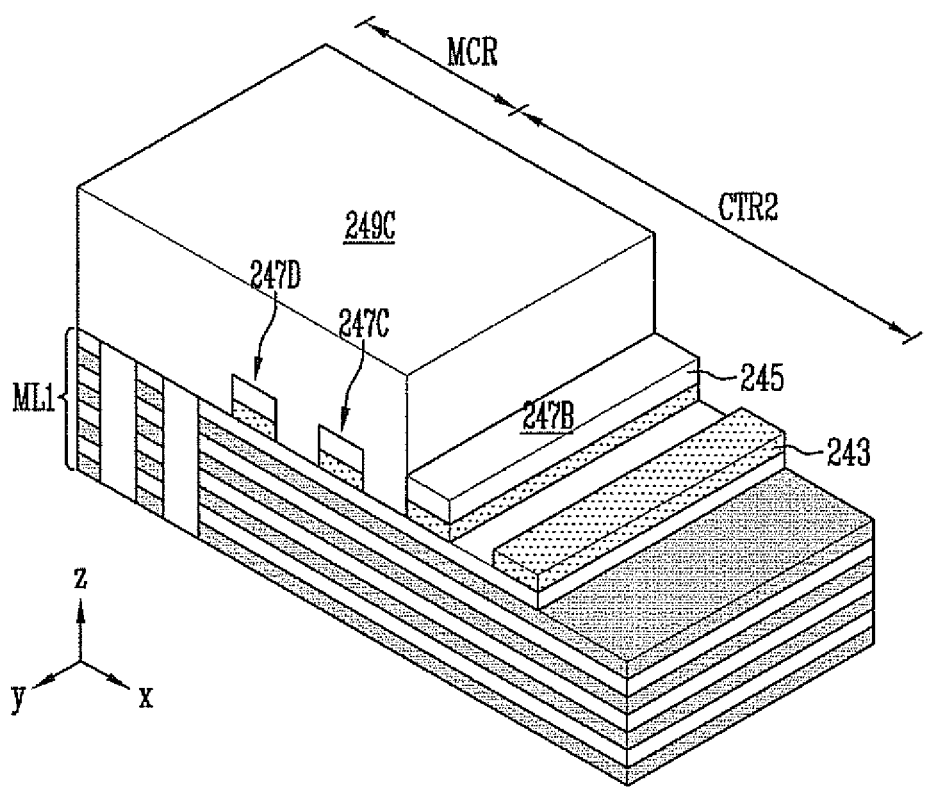
Figure 3G:
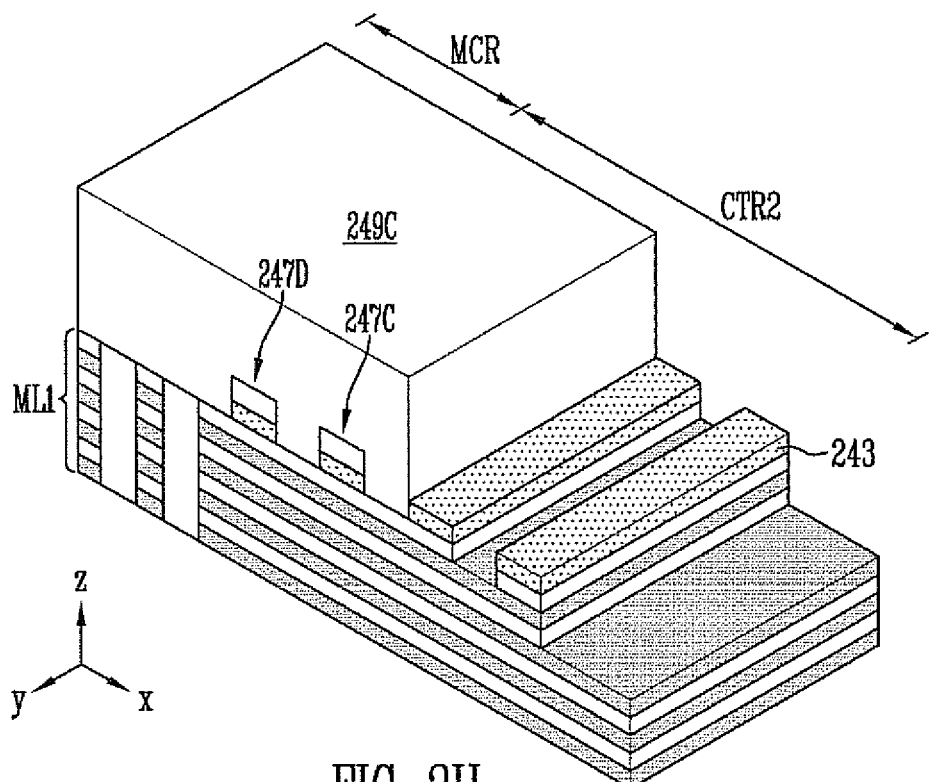
Figure 3H:
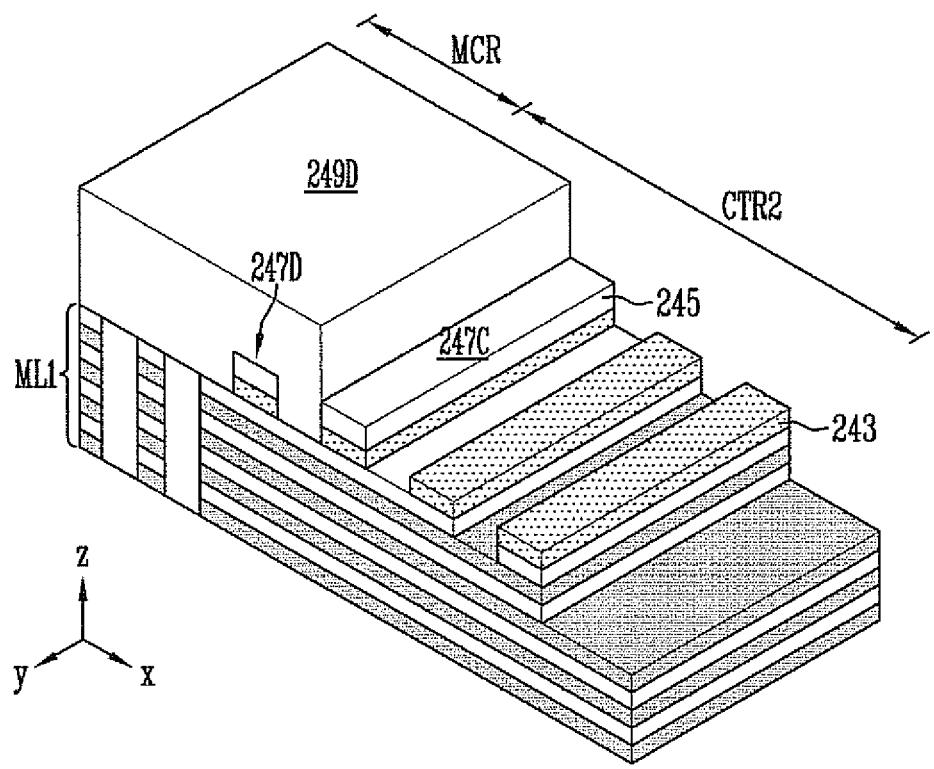
Figure 3I:
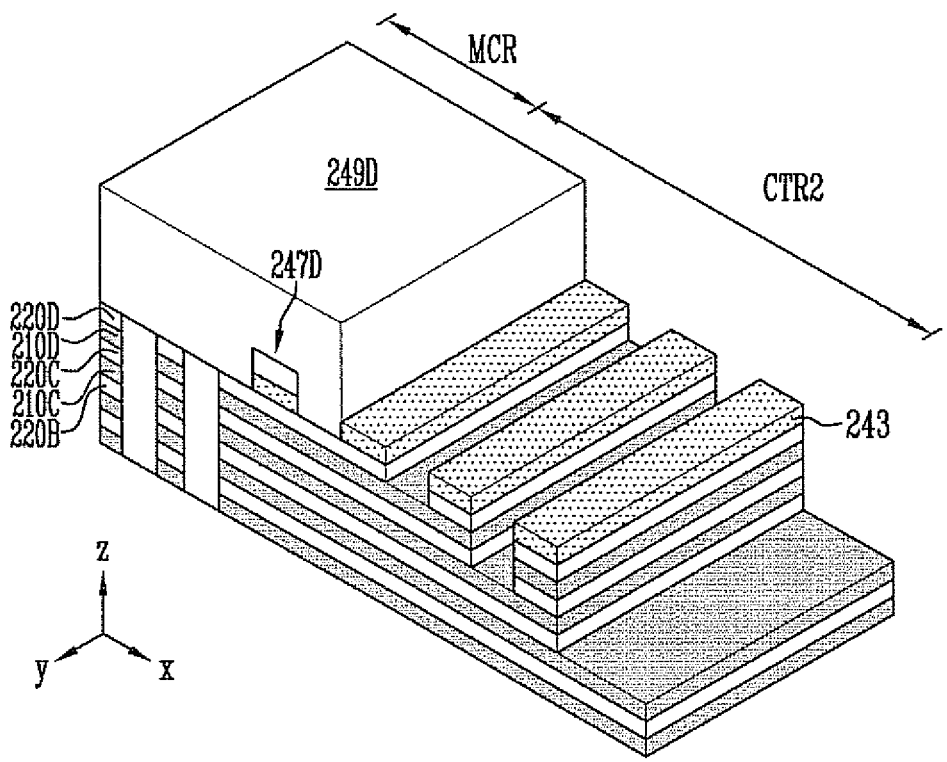
Figure 3J:
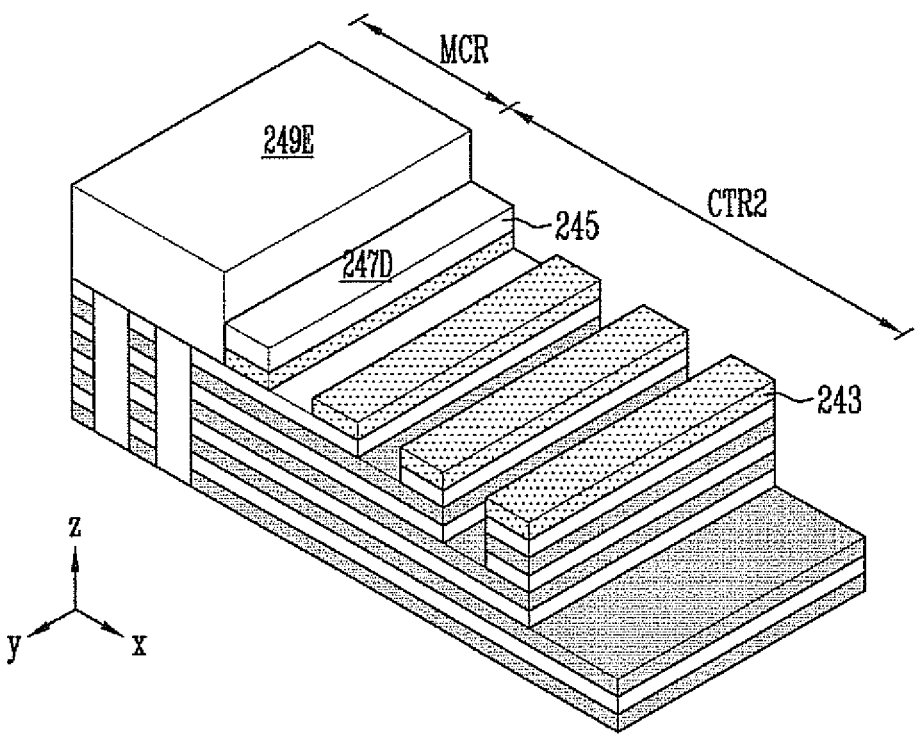
Figure 3K:
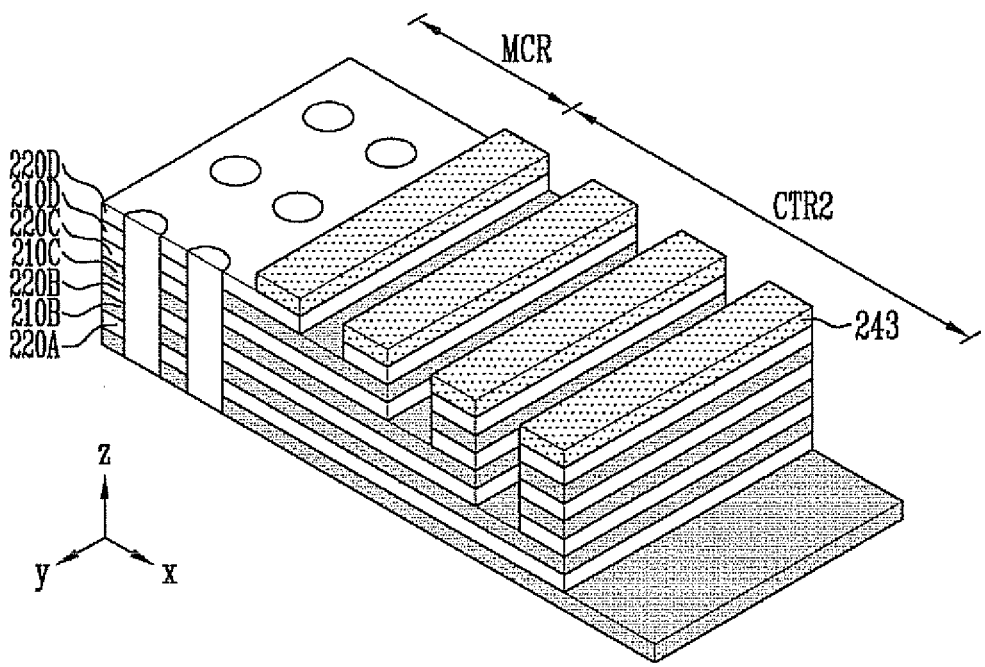
Figure 3L:
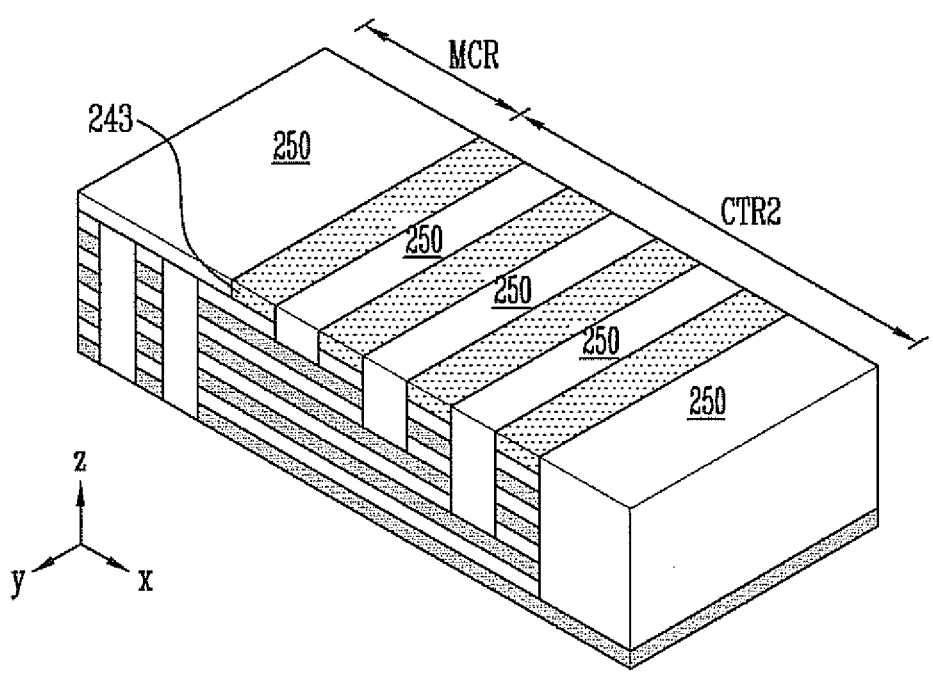
Figure 3M:
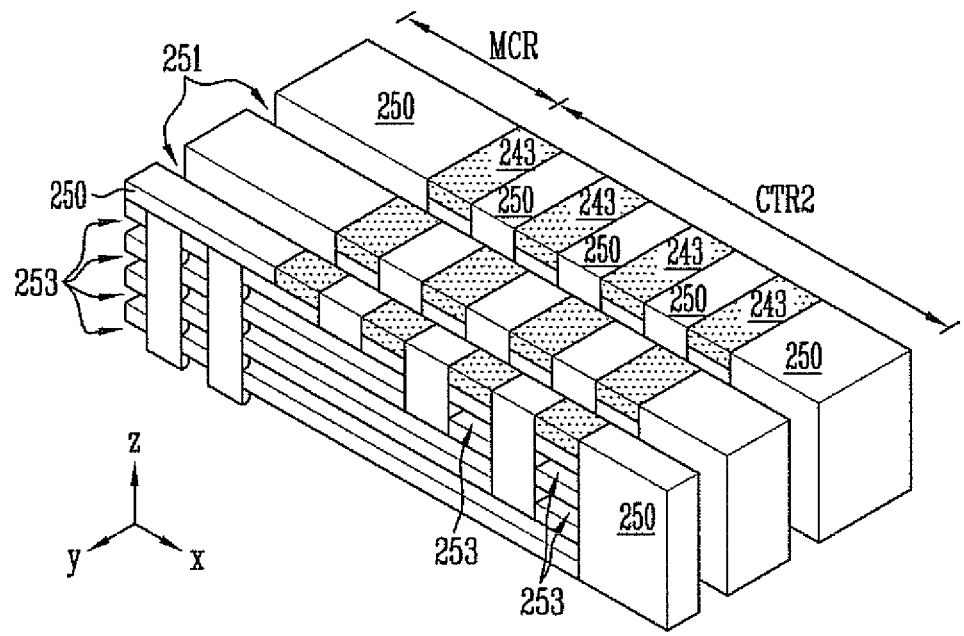
Figure 3N:
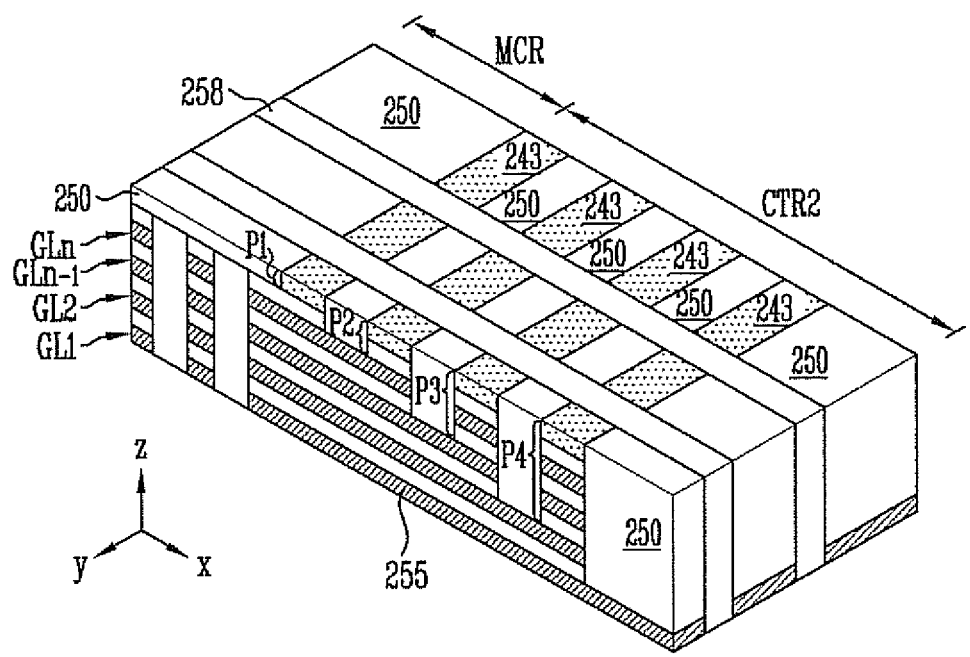
Figure 3O:
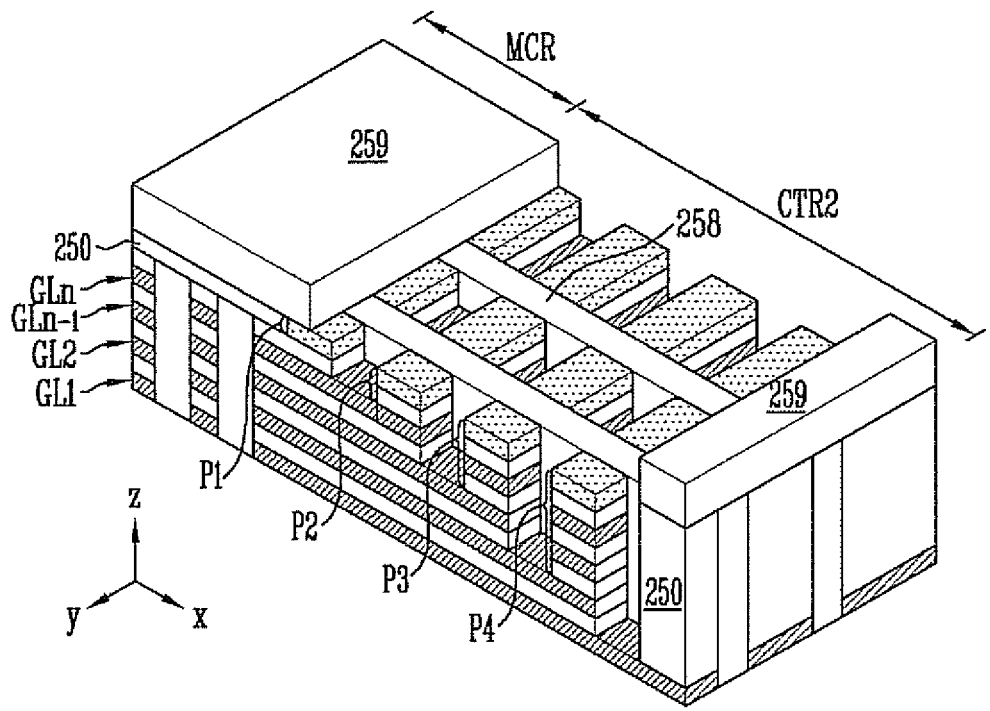
Figure 3P:
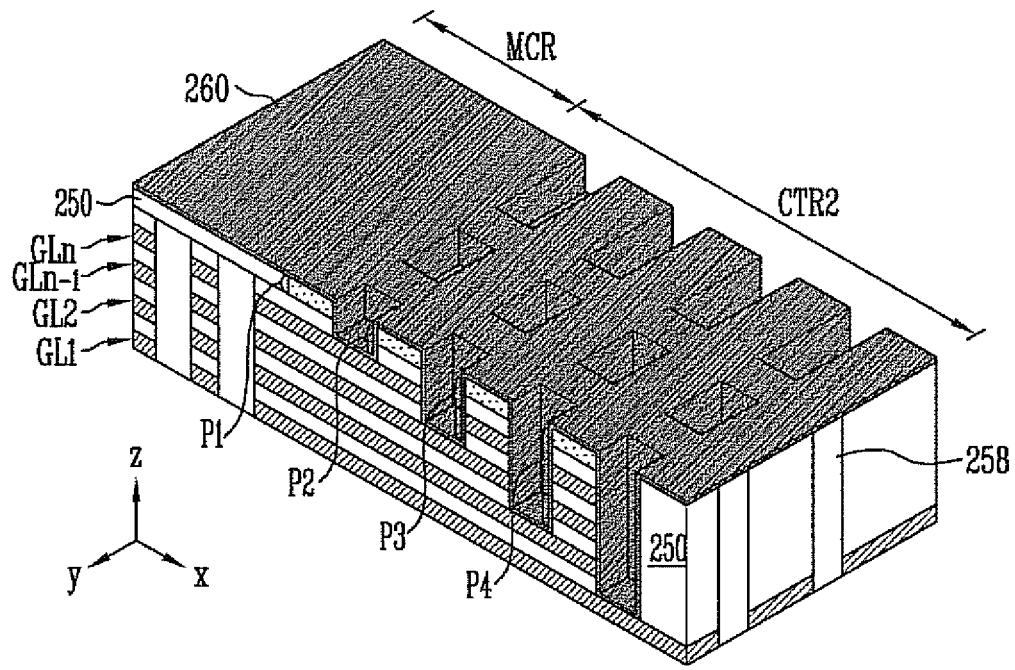
Figure 3Q:
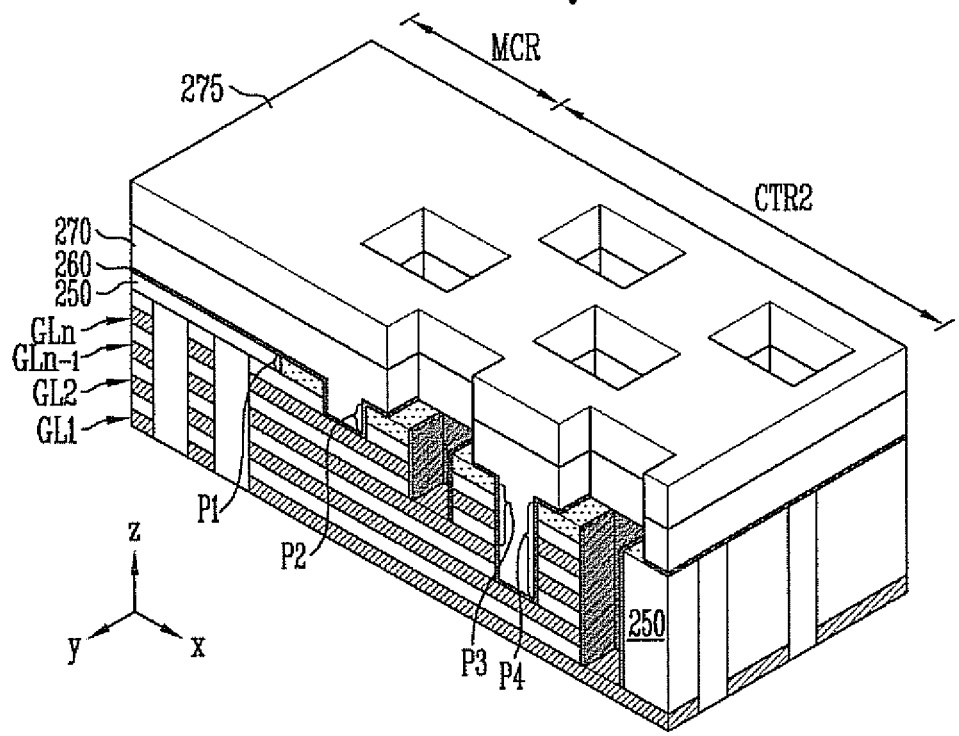
Figure 3R:
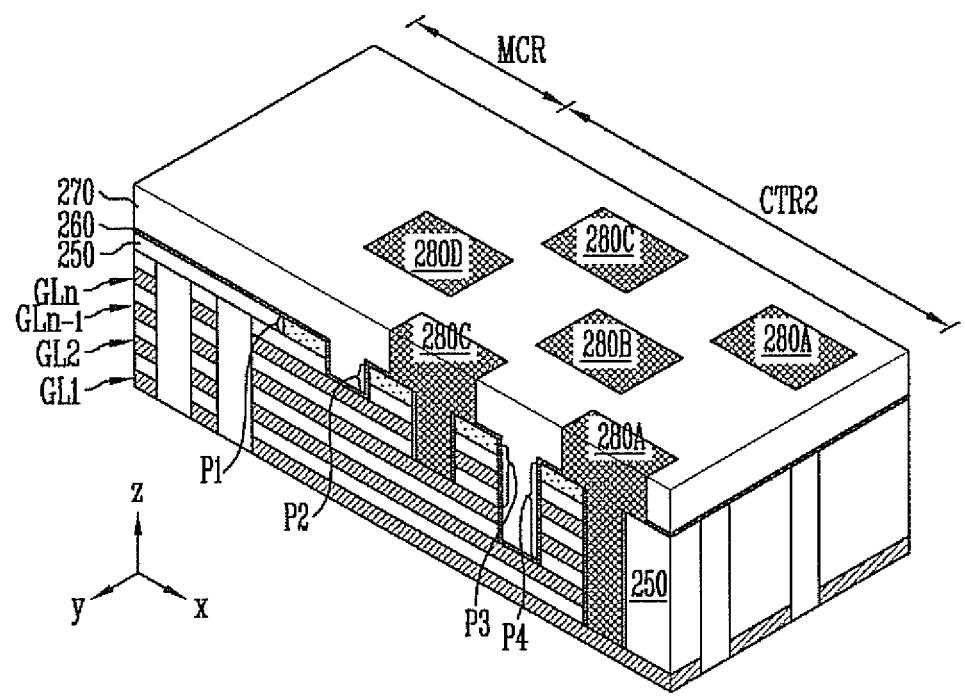

FIGS. 3A to 3R are perspective views of a method of manufacturing a semiconductor device according to a first embodiment of this disclosure.

Referring to FIG. 3A, first material layers 210A to 210D and second material layers 220A to 220D are alternately stacked over a substrate (not shown) including the memory cell region MCR and the contact region CTR2, thereby forming a multi-layered structure ML1. The number of each of the first material layers 210A to 210D and the second material layers 220A to 220D that form the multi-layered structure ML1 may be set in various ways.

Although not shown, a source line or a pipe gate may be formed between the substrate and the multi-layered structure ML1.

The first material layers 210A to 210D may be sacrificial layers formed in layers where gate lines will be formed. The first material layers 210A to 210D may be formed of material layers having a different etch selectivity against the second material layers 220A to 220D. The second material layers 220A to 220D are formed in same layers with first interlayer insulating layers. The second material layers 220A to 220D may be made of an insulating material for forming the first interlayer insulating layers. For example, the first material layers 210A to 210D may be formed of a nitride layer. The second material layers 220A to 220D may be formed of an oxide layer.

After forming the multi-layered structure ML1, holes that penetrate the multi-layered structure ML1 are formed. Vertical channel layers 237 are formed in the holes. Before forming the vertical channel layers 237, at least one of a charge blocking layer, a charge trap layer, and a tunnel insulating layer may be further formed on the sidewall of each of the holes. The vertical channel layer may be formed to fill the hole fully. Otherwise, the vertical channel layer may be formed on the sidewall of the hole in such a way as to have an empty tube form. If each of the vertical channel layers 237 is formed to have the empty tube form, the inside of the tube defined by the vertical channel layer 237 may be filled with an insulating material. The charge blocking layer may be formed of an oxide layer, the charge trap layer may be formed of a nitride layer capable of trapping charges, and the tunnel insulating layer may be formed of a silicon oxide layer. The vertical channel layer 237 may be formed of a semiconductor layer. For example, the vertical channel layer 237 may be formed of a polysilicon layer.

Referring to FIG. 3B, barrier rib masks 247A to 247D are formed over the multi-layered structure ML1. A mask layer formed of a first material layer may be further formed before forming the barrier rib masks 247A to 247D, but the case where the mask layer is not formed is described as an example in the present embodiment.

The barrier rib masks 247A to 247D define regions where barrier rib patterns will be formed. The barrier rib masks 247A to 247D are formed in parallel to the contact region CTR2. Furthermore, the barrier rib masks 247A to 247D may be arranged at the same interval. The barrier rib masks 247A to 247D may be formed by a photolithography process using a first exposure mask that includes a light-shielding unit and an exposure unit.

Each of the barrier rib masks 247A to 247D may be formed of only a third material layer 243. Otherwise, each of the barrier rib masks 247A to 247D may be formed to have a stack structure of the third material layer 243 and a fourth material layer 245. In the present embodiment, the barrier rib mask has the stack structure of the third material layer 243 and the fourth material layer 245. The third material layer 243 has a different etch selectivity against the first material layers 210A to 210D and the second material layers 220A to 220D. The fourth material layer 245 has a different etch selectivity against the third material layer 243. For example, the third material layer 243 may be formed of a polysilicon layer or an amorphous carbon layer. The fourth material layer 245 may be made of TiN. Otherwise, the fourth material layer 245 may be formed of an oxide layer having a different etch selectivity against the third material layer 243. If the fourth material layer 245 is formed of an oxide layer, the fourth material layer 245 may be made of tetraethylorthosilicate (TEOS). If the fourth material layer 245 is made of TiN, the fourth material layer 245 may be used as a material layer that may be used to detect an etch process switching point in a subsequent etch process. If each of the barrier rib masks 247A to 247D is formed of only the third material layer 243, the third material layer 243 may be made of material having a different etch selectivity to the first material layers 210A to 210D and the second material layers 220A to 220D. The third material layer 243 may be used to detect an etch process switching point in a subsequent etch process.

Referring to FIG. 3C, an etch mask 249A that covers the barrier rib masks 247A to 247D is formed. The etch mask 249A may be a photoresist pattern patterned by a photolithography process.

Referring to FIG. 3D, an etch process for reducing the size of the etch mask 249A is performed until the barrier rib mask 247A adjacent to the edge of the contact region CTR2, among the barrier rib masks 247A to 247D, is opened.

Referring to FIG. 3E, the second material layer 220D, i.e., the highest layer of the multi-layered structure ML1 not covered by the barrier rib mask 247A and the remained etch mask 249B, is etched. Here, the fourth material layer 245 of the barrier rib mask 247A opened by the etch mask 249B may be removed, thereby opening the third material layer 243.

The etch process for reducing the size of the etch mask 249A may be switched into a process of etching the second material layer 220D through an end point detection (EPD) method using the third material layer 243 or the fourth material layer 245 of the barrier rib mask 247A.

Referring to FIG. 3F, an etch process for reducing the size of the etch mask 249B is performed to increase the number of barrier rib masks exposed from the edge of the contact region CTR2.

Referring to FIG. 3G, the first material layer 210D and the second material layers 220C, which are not covered by the remained etch mask 249C, and the barrier rib masks 247A and 247B are etched. Here, the fourth material layer 245 of the barrier rib mask 247B opened by the etch mask 249C may be removed, thereby exposing the third material layer 243.

The etch process for reducing the size of the etch mask 249B may be switched into a process of etching the first material layer 210D and the second material layers 220D and 220C through an EPD method using the third material layer 243 or the fourth material layer 245 of the barrier rib mask 247B.

Referring to FIG. 3H, an etch process for reducing the size of the etch mask 249C is performed to increase the number of barrier rib masks exposed from the edge of the contact region CTR2.

Referring to FIG. 3I, the first material layers 210D and 210C and the second material layers 220D, 220C, and 2208, which are not covered by the remained etch mask 249D, and the barrier rib masks 247A, 247B, and 247C are etched. Here, the fourth material layer 245 of the barrier rib mask 247C opened by the etch mask 249D may be removed, thereby opening the third material layer 243.

The etch process for reducing the size of the etch mask 249C may be switched into a process of etching the first material layers 210D and 210C and the second material layers 220D, 220C, and 220B through an EPD method using the third material layer 243 or the fourth material layer 245 of the barrier rib mask 247C.

Referring to FIG. 3J, an etch process for reducing the size of the etch mask 249D is performed so that the number of barrier rib masks exposed from the edge of the contact region CTR2 is increased.

Referring to FIG. 3K, the first material layers 210D, 210C, and 210B and the second material layers 220D, 220C, 220B, and 220A, which are not covered by the remained etch mask 249E and the barrier rib masks 247A, 247B, 247C, and 247D, are etched. Here, the fourth material layer 245 of the barrier rib mask 247D opened by the etch mask 249E may be removed, thereby opening the third material layer 243.

The etch process for reducing the size of the etch mask 249E may be switched into a process of etching the first material layers 210D, 210C, and 210B and the second material layers 220D, 220C, 220B, and 220A through an EPD method using the third material layer 243 or the fourth material layer 245 of the barrier rib mask 247D.

As described above, an etch process for reducing the size of the etch mask is repeated until the barrier rib mask 247D adjacent to the memory cell region MCR is opened. A process of etching the first and the second material layers is performed whenever the number of barrier rib masks, exposed by a remained etch mask, increases. As a result, the first material layers 210A to 210D formed in the gate line region are patterned toward a lower layer so that they are protruded toward the contact region CTR2.

The first material layers 210C and 210D and the second material layers 220B to 220D that have been patterned in the same form as the third material layer 243 of the barrier rib mask define regions where barrier rib patterns will be formed.

Referring to FIG. 3L, a second interlayer insulating layer 250 is formed over the entire structure. A surface of the second interlayer insulating layer 250 may be polished so that the third material layer 243 is exposed.

Referring to FIG. 3M, slits 251 that penetrate the second interlayer insulating layer 250, the third material layers 243, the first material layers 210A to 210D, and the second material layers 220A to 220D are formed by an etch process. The slits 251 may be formed in a direction to cross the barrier rib masks in FIG. 3B.

Conductive layer trenches 253 are formed by selectively etching only the first material layers 210A to 210D through the slits 251.

Referring to FIG. 3N, the conductive layer trenches 253 are filled with a conductive layer 255 for forming gate lines GL1 to GLn, thereby forming the gate lines GL1 to GLn and barrier rib patterns P1 to P4. Before filling the conductive layer trenches 253 with the conductive layer 255, a layer not formed on the outer wall of the vertical channel layer 237 among a charge blocking layer, a charge trap layer, and a tunnel insulating layer may be further formed on a surface of the conductive layer trenches 253.

Next, the slits 251 are filled with an insulating material 258. The insulating material 258 filled into the slits 251 may be formed of a material layer having a different etch selectivity against the second interlayer insulating layer 250.

Referring to FIG. 3O, an etch mask 259 for opening some regions of the contact region CTR2 where contact plugs will be formed is formed. The etch mask 259 may be a photoresist pattern formed by a photolithography process.

The regions where the contact plugs may be formed are opened by etching the second interlayer insulating layer 250 faster than the insulating material 458, opened by the etch mask 259, or etching the second interlayer insulating layer 250 using an etch material that etches only the second interlayer insulating layer 250.

Referring to FIG. 3P, the etch mask 259 is removed. A thin insulating layer 260 is formed on the entire structure including opened regions where the contact plugs are formed later. The thin insulating layer 260 is formed of a material layer having a different etch selectivity against a third interlayer insulating layer to be formed subsequently so that the thin insulating layer 260 can function as an etch-stop layer in a subsequent process of forming contact holes. For example, the thin insulating layer 260 may be formed of a nitride layer.

Referring to FIG. 3Q, a third interlayer insulating layer 270 is formed over the thin insulating layer 260. An etch mask 275 is formed over the third interlayer insulating layer 270. The etch mask 275 may be a photoresist pattern formed by a photolithography process.

Part of the third interlayer insulating layer 270 opened through the etch mask 275 is etched. A process of etching part of the third interlayer insulating layer 270 may be performed until the thin insulating layer 260 is exposed.

Part of the thin insulating layer 260 opened through the etch mask 275 is etched so that the gate lines GL1 to GLn are opened. A process of etching part of the thin insulating layer 260 may use an anisotropic etch method so that the thin insulating layer 260 formed on the sidewalk of the barrier rib patterns P1 to P4 can remain.

Contact holes through which the gate lines GL1 to GLn are exposed through part of the third interlayer insulating layer 270 and part of the thin insulating layer 260 by the etch processes of the third interlayer insulating layer 270 and the thin insulating layer 260.

Referring to FIG. 3R, the etch mask 275 is removed, and contact plugs 280A to 280D are formed by filling the contact holes with a conductive material. The contact plugs 280A to 280D include a first group contact plug (280B, 280D) coupled to the even-numbered gate lines GL2 and GLn and a second group contact plug (280A, 280C) coupled to the odd-numbered gate lines GL1 and GLn-1. The contact plugs 280A to 280D are arranged in zigzags.

In accordance with the above method, this disclosure can prevent misalignment between the contact plugs 280A to 280D and the gate lines GL1 to GLn because the contact plugs 280A to 280D can be self-aligned in the spaces between the barrier rib patterns P1 to P4. Furthermore, in this embodiment, the intervals between the barrier rib patterns P1 to P4 may be set to target values depending on the arrangement of the exposure unit and the light-shielding unit of an exposure mask for forming the barrier rib masks. The intervals may be set equally. Accordingly, the gate lines GL1 to GLn exposed between the barrier rib patterns can have a uniform width. Furthermore, this embodiment may secure an alignment margin of the contact plugs 280A to 280D because the contact plugs 280A to 280D are arranged in zigzags.

Figure 4:
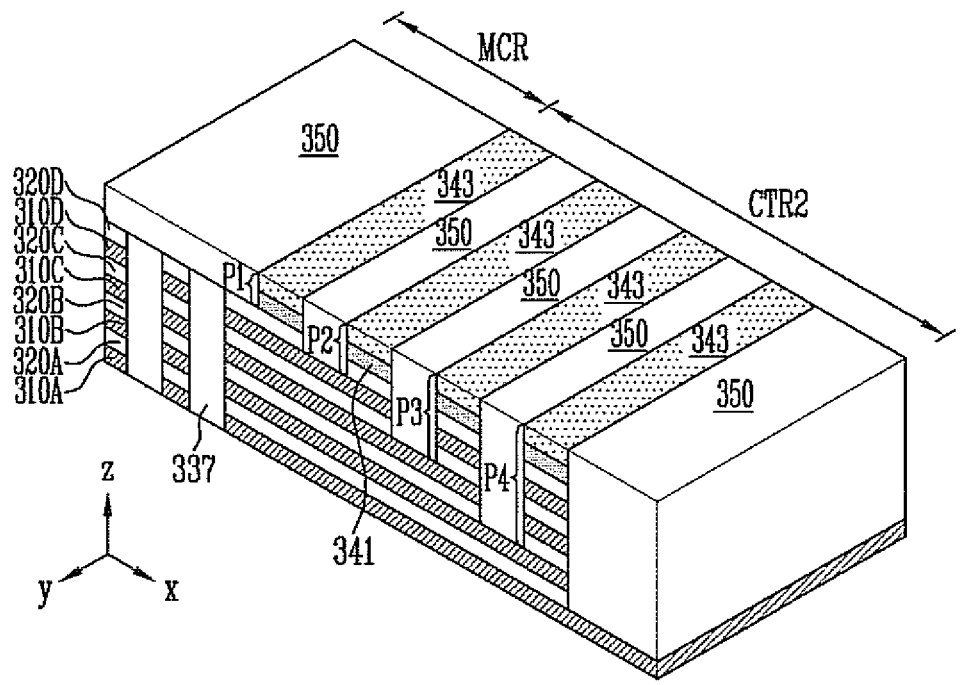
FIG. 4 is a perspective view illustrating a method of manufacturing a semiconductor device according to a second embodiment of this disclosure.

FIG. 4 is a perspective view illustrating a method of manufacturing a semiconductor device according to a second embodiment of this disclosure.

Referring to FIG. 4, first material layers 310A to 310D and second material layers 320A to 320D are alternately stacked over a substrate (not shown) including the memory cell region MCR and the contact region CTR2. The first material layers 310A to 310D may be formed in layers in which gate lines will be formed and may be formed of a conductive layer for the gate lines. The second material layers 320A to 320D may be formed in the same layers where first interlayer insulating layers are formed later. The second material layers 320A to 320D may be formed of an insulating material for forming the first interlayer insulating layers.

In FIG. 3A, holes that penetrate the first material layers 310A to 310D and the second material layers 320A to 320D are formed. A charge blocking layer, a charge trap layer, and a tunnel insulating layer (not shown) are sequentially formed on the sidewall of each of the holes. Vertical channel layers 337 are formed within the holes.

A mask layer 341 having a different etch selectivity against the first material layers 310A to 310D and the second material layers 320A to 320D may be further formed over the entire structure in which the vertical channel layers 337 are formed. The mask layer 341 may be formed of a nitride layer. Next, in FIG. 3B, barrier rib masks including third material layers 343 are formed.

In FIGS. 3C to 3K, an etch mask that covers the barrier rib masks is formed. An etch process for reducing the size of the etch mask is repeated until a barrier rib mask adjacent to the memory cell region MCR among the barrier rib masks is opened. Furthermore, a process of etching the first and the second material layers is performed whenever the number of barrier rib masks, exposed by a remained etch mask, increases. As a result, the first material layers 310A to 310D formed in the gate line region are patterned toward a lower layer so that they are protruded toward the contact region CTR2.

The etch mask and the mask layer 341 formed in the memory cell region MCR are removed. As a result, the mask layer 341 remains under the third material layers 343 of the barrier rib masks. The mask layer 341, the first material layers 310C and 310D, and the second material layers 320B to 320D which have been patterned in the same form as the third material layers 343 of the barrier rib masks become stack layers that form barrier rib patterns P1 to P4.

A second interlayer insulating layer 350 is formed over the entire structure in which the barrier rib patterns P1 to P4 are formed. A surface of the second interlayer insulating layer 350 may be polished to expose the third material layers 343.

After forming the second interlayer insulating layer 350, a process of forming slits may be further performed in FIG. 3M. If the slits are formed, a process of filling the slits with an insulating material is performed. In the second embodiment, since the first material layers 310A to 310D are formed of a conductive layer for the gate lines, a process of forming conductive layer trenches and a process of filling the conductive layer trenches with the conductive layer for the gate lines may be omitted.

Subsequent processes are the same as those described above with reference to FIGS. 3O to 3R, and accordingly, a description thereof is omitted.

Figure 5:
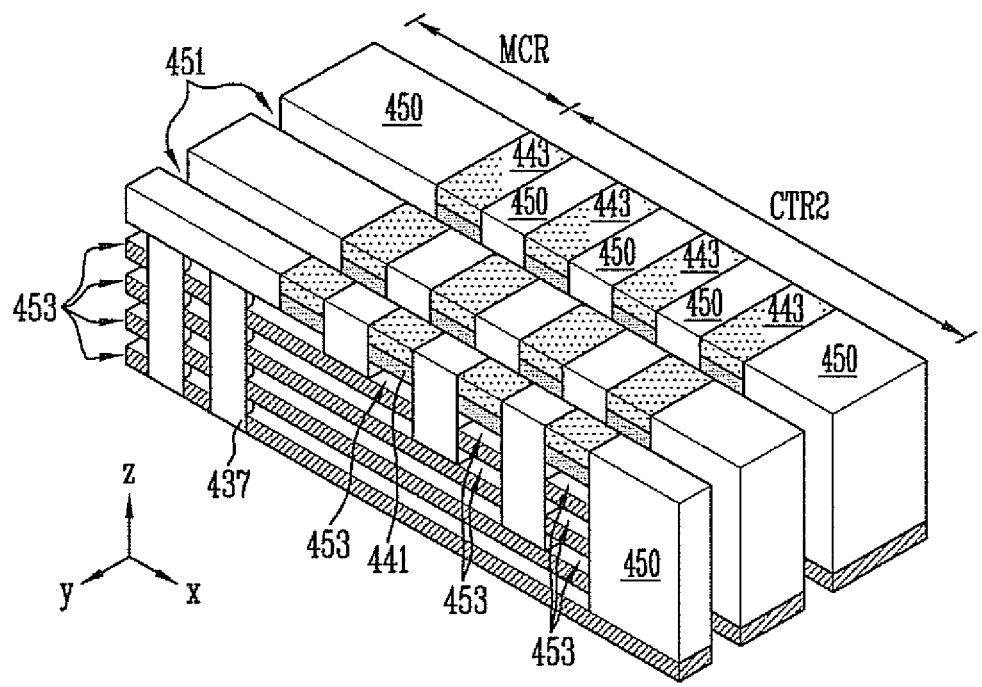
FIG. 5 is a perspective view illustrating a method of manufacturing a semiconductor device according to a third embodiment of this disclosure.

FIG. 5 is a perspective view illustrating a method of manufacturing a semiconductor device according to a third embodiment of this disclosure.

Referring to FIG. 5, first material layers 410A to 410D and second material layers (not shown) are alternately stacked over a substrate (not shown) including the memory cell region MCR and the contact region CTR2. The first material layers 410A to 410D may be formed in layers where gate lines are formed later. The first material layers 410A to 410D may be formed of a conductive layer for the gate lines. The second material layers may be sacrificial layers formed in layers in which first interlayer insulating layers will be formed. The second material layers may have a different etch selectivity against the first material layers 410A to 410D. For example, the first material layers 410A to 410D may be formed of a doped polysilicon layer, and the second material layers may be formed a doped polysilicon layer.

In FIG. 3A, holes that penetrate the first material layers 410A to 410D and the second material layers are formed. A charge blocking layer, a charge trap layer, and a tunnel insulating layer (not shown) are sequentially formed on the sidewall of each of the holes. Vertical channel layers 437 are formed within the holes.

A mask layer 441, having a different etch selectivity against the first material layers 410A to 410D and the second material layers, may be further formed over the entire structure in which the vertical channel layers 437 are formed. In FIG. 3B, barrier rib masks including third material layers 443 are formed.

In FIGS. 3C to 3K, an etch mask that covers the barrier rib masks is formed. An etch process for reducing the size of the etch mask is repeated until a barrier rib mask adjacent to the memory cell region MCR, among the barrier rib masks, is opened. Furthermore, a process of etching the first and the second material layers is performed whenever the number of barrier rib masks, exposed by a remained etch mask, increases. As a result, the first material layers 410A to 410D formed in the gate line region are patterned toward a lower layer so that they are protruded toward the contact region CTR2.

The etch mask and the mask layer 441 formed in the memory cell region MCR are removed. As a result, the mask layer 441 remains under the third material layers 443 of the barrier rib masks. The mask layer 441, the first material layers 410C and 410D, and the second material layers, which have been patterned in the same form as the third material layers 443 of the barrier rib masks, define regions where barrier rib patterns are formed later.

In FIG. 3L, after removing the mask layer 441 in the memory cell region MCR, a second interlayer insulating layer 450 is formed over the entire structure. A surface of the second interlayer insulating layer 450 may be polished to expose the third material layers 443.

In FIG. 3M, slits 451 are formed by etching the second interlayer insulating layer 450, the third material layers 443 of the barrier rib masks, the first material layers 410A to 410D and 441 including the remaining mask layer 441, and the second material layers. The slits 451 penetrate the second interlayer insulating layer 450, the third material layers 443 of the barrier rib masks, the first material layers 410A to 410D and 441 including the remaining mask layer 441, and the second material layers.

Insulating layer trenches 453 are formed by selectively removing only the second material layers through the slits 451. The insulating layer trenches 453 are filled with an insulating material for first interlayer insulating layers. Next, the slits 451 are filled with an insulating material, thereby forming a structure, as shown in FIG. 3N.

Subsequent processes are the same as those described above with reference to FIGS. 3O to 3R, and accordingly, a description thereof is omitted.

Figure 6:
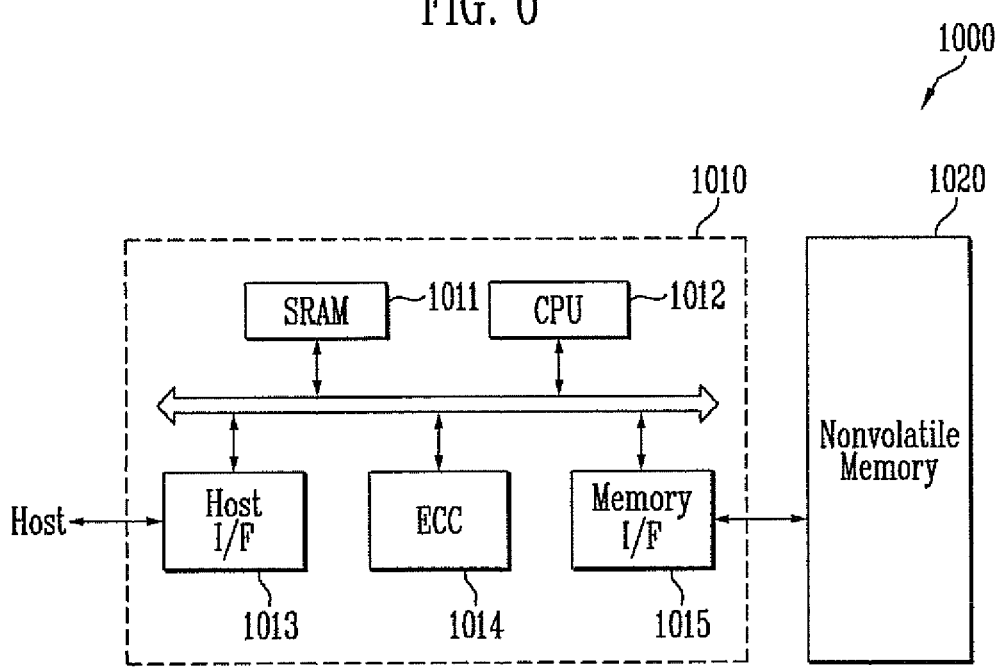
FIG. 6 is a schematic block diagram of a memory system according to embodiments of this disclosure.

FIG. 6 is a schematic block diagram of a memory system according to embodiments of this disclosure.

Referring to FIG. 6, the memory system 1000 according to the embodiments includes a memory device 1020 and a memory controller 1010.

The memory device 1020 includes at least one of the semiconductor memory devices formed according to the first to third embodiments. The memory device 1020 includes the substrate, the string structure, the barrier rib patterns, and first contact plugs. The substrate is configured to include the memory cell region and the contact regions. The string structure is configured to include the conductive layers and the first interlayer insulating layers alternately stacked over the substrate and protruded toward a lower layer from the memory cell region toward the contact regions. The barrier rib patterns are spaced apart from one another, formed over the conductive layers in the contact region. The barrier rib patterns are configured to open the layers of the conductive layers in the contact region through the spaced spaces. The first contact plugs are formed by a process of filling a conductive material into the space between the barrier rib patterns adjacent to each other. The first contact plugs are coupled to the conductive layers in the contact region.

The memory controller 1010 controls the exchange of data between a host Host and the memory device 1020. The memory controller 1010 may include a central processing unit (CPU) 1012 for controlling the overall operation of the memory system 1000. The memory controller 1010 may include SRAM 1011 used as the operating memory of the CPU 1012. The memory controller 1010 may further include a host interface (I/F) 1013 and a memory I/F 1015. The host I/F 1013 may be equipped with a data exchange protocol between the memory system 1000 and the host. The memory I/F 1015 may couple the memory controller 1010 and the memory device 1020. The memory controller 1010 may further include an error correction code block (ECC) 1014. The ECC 1014 can detect errors in data read from the memory device 1020 and correct the detected errors. Although not shown, the memory system 1000 may further include a ROM device for storing code data for interfacing with the host. The memory system 1000 may be used as a portable data storage card. In embodiments, the memory system 1000 may be embodied using a solid state disk (SSD) that may replace the hard disk of a computer system.

In accordance with this disclosure, the accuracy of alignment between the contact plugs and the conductive layers can be improved because the contact plugs are formed between the barrier rib patterns. Accordingly, reliability of a 3-D semiconductor device can be improved.

What is claimed is:

1. A semiconductor device, comprising:
   a substrate comprising a memory cell region and a contact region;
   a stacked structure comprising conductive layers and first interlayer insulating layers alternately stacked over the substrate, wherein the conductive layers and the first interlayer insulating layers extend from the memory cell region to the contact region;
   barrier rib patterns including mask layer patterns, spaced apart from one another, provided over the stacked structure in the contact region;
   spaces passing through at least one of the conductive layers and the first interlayer insulating layers between the mask layer patterns, wherein the spaces are formed to open the conductive layers, respectively; and
   contact plugs and insulating layers alternately filled in the spaces, wherein a length of each of the contact plugs and the insulating layers increases as a distance of each of the contact plugs and the insulating layers from the memory cell region increases.

2. The semiconductor device of claim 1, wherein the spaces divide the stacked structure formed in the contact region into the barrier rib patterns.

3. The semiconductor device of claim 1, wherein each of the mask layer patterns includes a first mask layer and a second mask layer over the first mask layer.

4. The semiconductor device of claim 3, wherein the first mask layer includes insulating material having a different etch selectivity from the conductive layers and the first interlayer insulating layers.

5. The semiconductor device of claim 1, further comprising a thin insulating layer formed between the contact plugs and the barrier rib patterns.

6. The semiconductor device of claim 1, wherein the barrier rib patterns are arranged at a uniform interval.

* * * * *